(12) United States Patent
Ma

(10) Patent No.: US 9,491,864 B2
(45) Date of Patent: Nov. 8, 2016

(54) UNPACKED STRUCTURE FOR POWER DEVICE OF RADIO FREQUENCY POWER AMPLIFICATION MODULE AND ASSEMBLY METHOD THEREFOR

(71) Applicant: Innogration (SuZhou) Co., Ltd., Jiangsu (CN)

(72) Inventor: Gordon Chiang Ma, Jiangsu (CN)

(73) Assignee: Innogration (Suzhou) Co., Ltd. (CN)

( * ) Notice: Subject to any disclaimer, the term of this patent is extended or adjusted under 35 U.S.C. 154(b) by 0 days.

(21) Appl. No.: 14/395,177

(22) PCT Filed: Mar. 18, 2013

(86) PCT No.: PCT/CN2013/072796
§ 371 (c)(1),
(2) Date: Oct. 17, 2014

(87) PCT Pub. No.: WO2013/159612
PCT Pub. Date: Oct. 31, 2013

(65) Prior Publication Data
US 2015/0103491 A1 Apr. 16, 2015

(30) Foreign Application Priority Data

Apr. 24, 2012 (CN) .......................... 2012 1 0122141

(51) Int. Cl.
*H05K 7/20* (2006.01)
*H05K 1/18* (2006.01)
(Continued)

(52) U.S. Cl.
CPC .............. *H05K 1/183* (2013.01); *H01L 23/13* (2013.01); *H01L 23/36* (2013.01); *H01L 23/552* (2013.01);
(Continued)

(58) Field of Classification Search
CPC ............................ G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 5,838,543 A * 11/1998 Nakamura .......... H01L 23/3677
165/80.2
6,018,465 A * 1/2000 Borkar .................... G06F 1/183
257/E23.084

(Continued)

FOREIGN PATENT DOCUMENTS

CN 1462088 12/2003
CN 101553918 10/2009
(Continued)

OTHER PUBLICATIONS

International Search Report for PCT/CN2013/072796 mailed Jun. 20, 2013.

*Primary Examiner* — Anthony Haughton
*Assistant Examiner* — Razmeen Gafur
(74) *Attorney, Agent, or Firm* — RatnerPrestia

(57) ABSTRACT

An unpacked structure for a power device of radio frequency power amplification module and assembly method therefor. The radio frequency power amplification module includes the power device, a heat dissipating plate and a printed circuit board, wherein the power device is embedded into the printed circuit board; the heat dissipating plate is arranged below the power device and the printed circuit board; the power device includes a carrier flange, a plurality of electronic elements and a plurality of lead wires; the electronic elements are directly welded on the carrier flange according to a design requirement; the power device and the printed circuit board are welded and fixed on the heat dissipating plate; and the electronic elements on the power device are connected with one another through the lead wires and directly connected with the printed circuit board through the lead wires.

9 Claims, 3 Drawing Sheets

(51) Int. Cl.
    *H01L 23/552*     (2006.01)
    *H01L 23/13*     (2006.01)
    *H01L 23/36*     (2006.01)
    *H01L 23/66*     (2006.01)
    *H05K 1/02*     (2006.01)
    *H05K 3/32*     (2006.01)
    *H01L 23/473*     (2006.01)
    *H01L 23/053*     (2006.01)
    *H01L 23/31*     (2006.01)
    *H01L 23/00*     (2006.01)

(52) U.S. Cl.
    CPC ............ *H01L 23/66* (2013.01); *H01L 24/49* (2013.01); *H05K 1/021* (2013.01); *H05K 3/328* (2013.01); *H01L 23/053* (2013.01); *H01L 23/3121* (2013.01); *H01L 24/48* (2013.01); *H01L 2224/48091* (2013.01); *H01L 2224/48137* (2013.01); *H01L 2224/49175* (2013.01); *H01L 2924/00014* (2013.01); *H01L 2924/16152* (2013.01); *H01L 2924/3025* (2013.01); *H01L 2924/30107* (2013.01); *H05K 2201/10166* (2013.01); *Y10T 29/49144* (2015.01)

(56) References Cited

U.S. PATENT DOCUMENTS

| | | | | |
|---|---|---|---|---|
| 6,137,688 | A * | 10/2000 | Borkar | G06F 1/183 174/363 |
| 6,333,522 | B1 * | 12/2001 | Inoue | H01L 33/32 257/81 |
| 6,775,145 | B1 * | 8/2004 | Chen | H01L 23/49861 174/521 |
| 6,853,559 | B2 * | 2/2005 | Panella | H01L 23/49805 257/690 |
| 7,446,411 | B2 | 11/2008 | Condie | |
| 7,583,506 | B1 * | 9/2009 | Huang | B64G 1/428 174/252 |
| 2001/0026438 | A1 * | 10/2001 | Ploix | H05K 1/0263 361/688 |
| 2002/0131237 | A1 * | 9/2002 | Snyder | F28D 15/0233 361/719 |
| 2003/0024633 | A1 | 2/2003 | Ogura | |
| 2003/0034557 | A1 | 2/2003 | Gupta | |
| 2003/0060172 | A1 * | 3/2003 | Kuriyama | H04B 1/036 455/575.1 |
| 2003/0076174 | A1 * | 4/2003 | Tanoue | H01L 24/05 330/302 |
| 2003/0117220 | A1 * | 6/2003 | Kuriyama | H01L 23/552 330/302 |
| 2003/0137809 | A1 * | 7/2003 | Inoue | H05K 1/141 361/736 |
| 2004/0150099 | A1 | 8/2004 | Ding | |
| 2004/0222848 | A1 * | 11/2004 | Shih | H03F 1/30 330/66 |
| 2004/0246682 | A1 * | 12/2004 | Osakada | H01L 23/66 361/709 |
| 2005/0093013 | A1 * | 5/2005 | Mastromatteo | G02B 6/4228 257/100 |
| 2005/0199999 | A1 | 9/2005 | Shirasawa | |
| 2008/0136559 | A1 * | 6/2008 | Takahashi | H03H 7/465 333/167 |
| 2008/0142935 | A1 * | 6/2008 | Montoriol | H01L 23/49531 257/666 |
| 2008/0205008 | A1 * | 8/2008 | Sun | H01L 25/16 361/736 |
| 2008/0266803 | A1 * | 10/2008 | Golhardt | H02K 9/20 361/700 |
| 2008/0310120 | A1 * | 12/2008 | Wallrafen | H01L 23/3672 361/720 |
| 2009/0315701 | A1 * | 12/2009 | Anderson | G08B 21/04 340/539.1 |
| 2011/0096495 | A1 * | 4/2011 | Heise | H05K 1/0263 361/688 |
| 2012/0014059 | A1 * | 1/2012 | Zeng | H02M 7/003 361/690 |
| 2012/0300402 | A1 * | 11/2012 | Vos | H01L 23/427 361/701 |

FOREIGN PATENT DOCUMENTS

| | | |
|---|---|---|
| CN | 102623416 | 8/2012 |
| CN | 202633264 | 12/2012 |
| TW | 200411850 | 7/2004 |

* cited by examiner

UNPACKED STRUCTURE FOR POWER DEVICE OF RADIO FREQUENCY POWER AMPLIFICATION MODULE AND ASSEMBLY METHOD THEREFOR

The present application is the U.S. National Phase Application of PCT/CN2013/072796, filed on Mar. 18, 2013, which claims priority to Chinese Patent Application No. 201210122141.1, entitled "POWER DEVICE WITHOUT PACKAGE STRUCTURE IN RADIO FREQUENCY POWER AMPLIFIER MODULE AND ASSEMBLY METHOD THEREFOR", filed on Apr. 24, 2012 with the State Intellectual Property Office of People's Republic of China, both of which are incorporated herein by reference in their entireties.

FIELD

The disclosure relates to a design of a radio frequency power amplifier in wireless communication field, in particular to a power device without a package structure in a radio frequency power amplifier module and an assembly method thereof.

BACKGROUND

At present, in wireless communication field, a structure of a mainstream high-power radio frequency power amplifier module is shown in FIG. 1, which includes a packaged power device, a printed circuit board, and a heat dissipating plate disposed below the packaged power device and the printed circuit board. The packaged power device includes a ceramic package. When a user uses the packaged power device, the package device shields an inner part thereof from the user. Thus, the user may not modify a pre-matching configuration inside packaged power device, and performance of the device is principally limited by a design of manufacturers of the device. In addition, as shown in FIG. 2, the conventional packaged power device has an input and output pin. When a user uses the packaged power device, electronic elements of the packaged power device are connected to the input and output pin through bond-wires, and then the input and output pin is fixedly welded on the printed circuit board. In this way, the power device is electrically connected to the printed circuit board. Therefore, a width of a conductive portion of the printed circuit board may not be narrower than a width of the packaged device, which contradicts a current trend of device miniaturization. Furthermore, the package of the packaged device inevitably causes parasitic capacitance, the input and output pin has an inductance, and the process of welding the input and output pin to the printed circuit board may cause a large error, all of which may directly affect a matching circuit of the device, and thus affect performance indicators of the device.

SUMMARY

The disclosure is to provide a power device without a package structure in a radio frequency power amplifier module and an assembly method thereof. With the disclosure, problems caused by packaged devices are avoided, flexibility is greatly improved when the user uses the device, and cost is saved a lot. In addition, design freedom and performance may be improved, and user requirement for customized design may be met.

To solve the problems in conventional technology, technical solutions are provided according to the disclosure as follows.

A power device without a package structure in a radio frequency power amplifier module is provided. The radio frequency power amplifier module includes the power device, a heat dissipating plate and a printed circuit board, the power device is embedded into the printed circuit board, the heat dissipating plate is disposed below the power device and the printed circuit board, the power device includes a carrier flange, a plurality of electronic elements and bond-wires, and the electronic elements are adhered to the carrier flange according to a design requirement. The power device and the printed circuit board are fixedly welded on the heat dissipating plate, the electronic elements of the power device are connected with each other through the bond-wires, and the electronic elements are directly connected to the printed circuit board through the bond-wires.

The radio frequency power amplifier module further includes a shielding frame adapted to protect internal components of the printed circuit board and the power device disposed on the printed circuit board.

The electronic elements further include a die and a MOS capacitor, and the die and the MOS capacitor are welded on the carrier flange through a wafer welding device. The carrier flange is welded on the heat dissipating plate, and top surfaces of the electronic elements are flush with a top surface of the printed circuit board. Since the top surfaces of the electronic elements are flush with the top surface of the printed circuit board, in later wire bonding, the bond-wire between the die and the printed circuit board has a smooth bending angle, thereby reducing inductance introduced by the bond-wires. Herein, a condition that the top surfaces of the electronic elements are flush with the top surface of the printed circuit board is a preferred solution, and the top surface of the electronic elements are not limited to be flush with the top surface of the printed circuit board. In addition, on some occasions, the electronic elements of the power device further include an integrated passive device, directly connecting to other electronic elements and the PCB through the bond-wires.

Furthermore, a protective cover is disposed outside the power device; the protective cover is fixed on the printed circuit board; and the protective cover completely covers the power device to form a seal cavity, and is adapted to protect the power device and prevent impurities entering into the power device. The protective cover may effectively protect the bond-wires and the electronic elements on the surface of the power device; prevent external impurities (such as falling solder paste) entering into the surface of the power device; and preventing a pollution caused by external micro-molecule material and a damage caused by external force. In addition, the protective cover is fixed on the printed circuit board through a clamping slot or a bolt. In this way, the protective cover may be assembled and disassembled conveniently, thereby facilitating later debugging and examination for the power device.

Still furthermore, a sealant is applied on an edge, connected with the printed circuit board, of the protective cover. A sealing protective effect of the protective cover may be better by filling a joint gap between the protective cover and the printed circuit board with the sealant.

Currently, the heat dissipating plate is usually made of copper, copper tungsten alloy or copper molybdenum copper metal, which is beneficial to dissipating heat.

An assembly method for a radio frequency power amplifier module without a package structure is also provided according to the disclosure. The method specifically includes following assembly steps:

selecting a material and a size of a carrier flange according to a design requirement, and welding electronic elements on the carrier flange through a device;

welding the carrier flange adhered with the electronic elements on a heat dissipating plate, locating the printed circuit board at a position corresponding to the carrier flange (forming an opening on the printed circuit board, where the opening is matched to a shape and a position of the carrier flange), and welding the printed circuit board on the heat dissipating plate;

bonding, by a wire bonder, wires between the electronic elements and a matching circuit according to design requirement, and connecting the die and the MOS capacitor to the printed circuit board through bond-wires directly.

In the foregoing assembly method, preferably, a protective cover is disposed outside the power device, the protective cover is fixed on the printed circuit board and completely covers the power device, to form a seal cavity, and a sealant is applied on an edge connecting the protective cover with the printed circuit board.

Compared with the solutions in conventional technology, the disclosure is advantageous as follows.

Compared with a conventional packaged power device, the power device according to the disclosure does not have a ceramic package, and an input and output pin. In the disclosure, elements of the power device may be directly connected to a printed circuit board through bond-wires. In the disclosure, the user may perform an operation on the power device, and thus design freedom is improved. In addition, since the power device dose not have the input and output pin, solder and a ceramic frame disposed between the input and output pin and a carrier flange, undesirable inductance introduction is avoided, a horizontal distance between the die and the printed circuit board is shortened, an inductance of the bond-wire is reduced, an accuracy of integrating the power device and the printed circuit board is increased, and a performance of the radio frequency power amplifier module is improved.

BRIEF DESCRIPTION OF THE DRAWINGS

The disclosure is further described in the following in conjunction with drawings and embodiments.

In FIG. 1-FIG. 6, 1, power device; 2, printed circuit board; 3, heat dissipating plate; 4, input and output pin; 5, carrier flange; 6, die; 7, bond-wires; 8, MOS capacitor; 9, package casing; 10, electromagnetic interference shielding; 11, protective cover; 12 drive die; 13, integrated passive device; 14, integrated passive device.

DETAILED DESCRIPTION OF EMBODIMENTS

Foregoing solutions are further described in the following in conjunction with embodiments. It is should be understood that the embodiments are adapted to describe the disclosure and is not limited to the scope of the disclosure. Used implementation condition according to the embodiments may be further adjusted according to condition of specific manufacturers, and unspecified implementation condition usually is condition for normal experiments.

Embodiment

Figure 1:
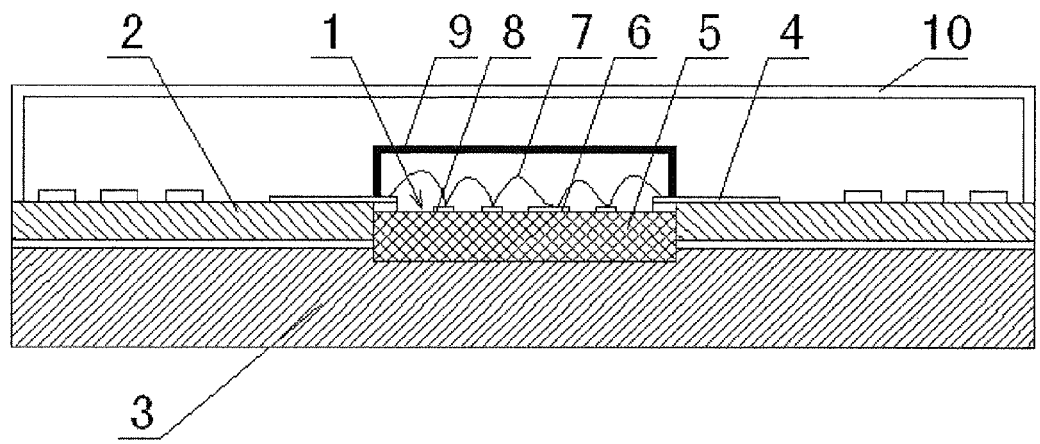
FIG. 1 is a schematic structural diagram of a conventional radio frequency power amplifier module.
Figure 2:
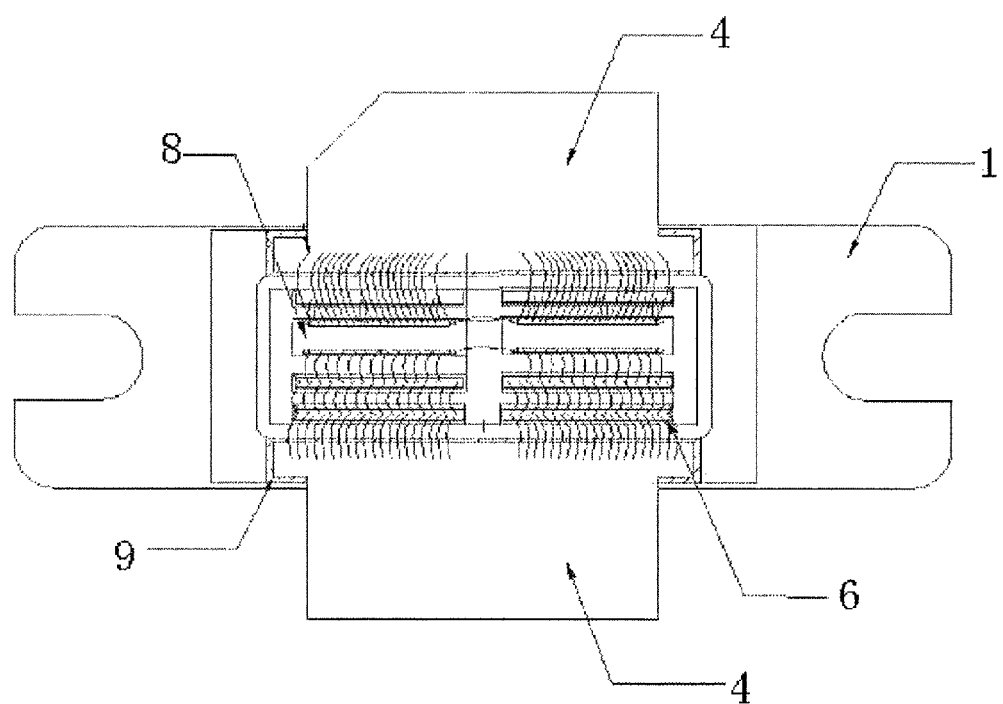
FIG. 2 is a schematic diagram of wire bonding of a packaged power device in a conventional radio frequency power amplifier module.
Figure 3:
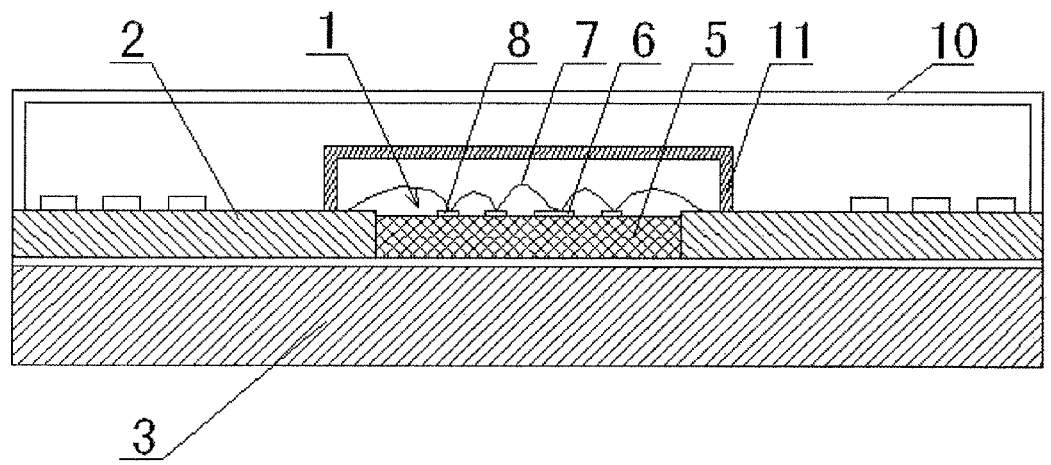
FIG. 3 is a schematic structural diagram of a radio frequency power amplifier module according to an embodiment of the disclosure.
Figure 4:
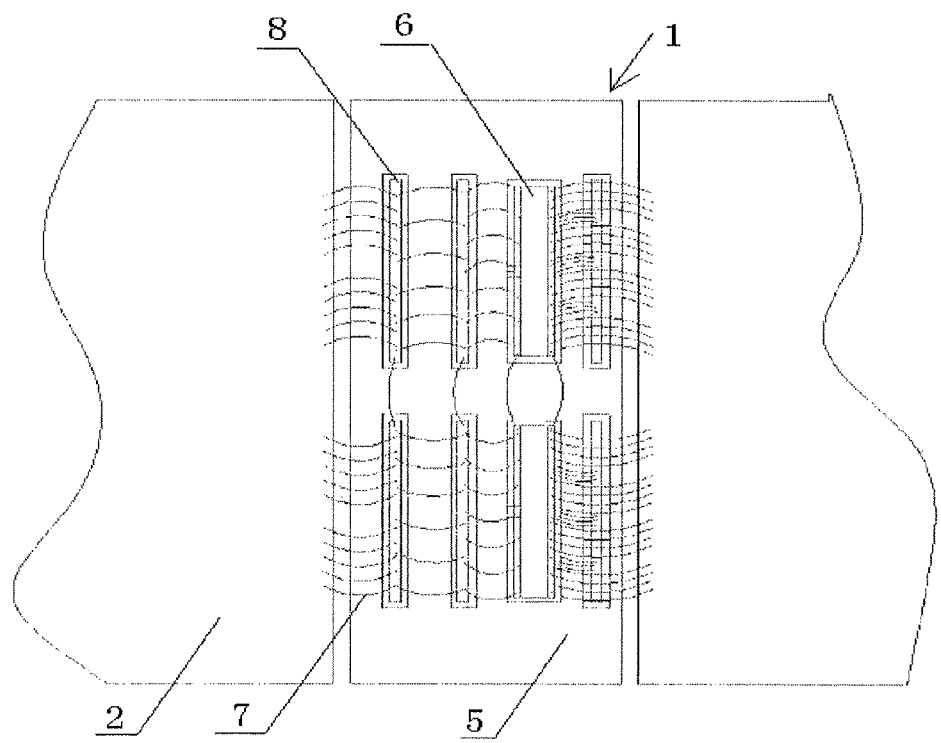
FIG. 4 is a schematic diagram of wire bonding of a power device in a radio frequency power amplifier module according to an embodiment of the disclosure.

FIG. 3 shows a power device without a package structure in a radio frequency power amplifier module according to the embodiment. The radio frequency power amplifier module includes a power device 1, a heat dissipating plate 3, a printed circuit board 2 and an electromagnetic interference shielding 10. The power device 1 is embedded into the printed circuit board 2. The heat dissipating plate 3 is disposed below the power device 1 and the printed circuit board 2. The power device 1 includes a carrier flange 5, multiple electronic elements and bond-wires 7. The electronic elements are adhered to the carrier flange 5 according to a design requirement. The power device 1 and the printed circuit board 2 are fixedly welded on the heat dissipating plate 3. The electronic elements of the power device 1 are connected with each other through the bond-wires 7. The die 6 and the MOS capacitor 8 are directly connected to the printed circuit board 2 through the bond-wires 7. The electromagnetic interference shielding 10 completely covers the printed circuit board 2, and is adapted to protect internal components of the printed circuit board 2 and the power device 1 disposed on the printed circuit board 2.

The electronic elements of the power device 1 include a die 6 and a MOS capacitor 8. The die 6 and the MOS capacitor 8 are welded to the carrier flange 5 through a wafer welding device, and then the carrier flange 5 is welded on the heat dissipating plate 3. Top surfaces of the electronic elements are flush with a top surface of the printed circuit board 2. The die 6 and the MOS capacitor 8 of the power device 1 are directly connected to the printed circuit board 2 through the bond-wires 7.

A protective cover 11 is disposed outside the power device. The protective cover 11 is fixed on the printed circuit board 2, which completely covers the power device 1 to form a seal cavity, and is adapted to protect the power device 1 and prevent impurities entering into the power device 1. The protective cover 11 is fixedly connected to the printed circuit board 2 through a clamping slot. In this way, the protective cover may be assembled and disassembled conveniently, thereby facilitating later debugging and examination for the power device 1.

A sealant is applied on an edge, connected with the printed circuit board 2, of the protective cover 11. A sealing protective effect of the protective cover 11 may be better by filling a joint gap between the protective cover 11 and the printed circuit board 2 with the sealant.

An assembly method of a radio frequency power amplifier module without a package structure is also provided according to the embodiment of the disclosure. Based on the power device without a package structure in the radio frequency power amplifier module described above, the assembly method specifically includes following assembly steps:

first, selecting a material and a size of a carrier flange according to design requirement, and welding a die 6 and a MOS capacitor 8 on the carrier flange 5 through a device;

second, welding the carrier flange 5 adhered with the die 6 and the MOS capacitor 8 on a heat dissipating plate 3, locating the printed circuit board 2 at a position corresponding to the carrier flange 5 (forming an open on the printed circuit board 2, where the opening is matched to a shape and a position of the carrier flange 5), and welding a printed circuit board 2 on the heat dissipating plate 3;

last, bonding, by a wire bonder, wires between the electronic elements and a matching circuit according to the design requirement, and connecting the die 6 and the MOS capacitor 8 connected to the printed circuit board 2 through the bond-wires 7 directly.

Compared with a conventional packaged power device, a power device 1 according to the embodiment does not have a ceramic package, and an input and output pin 4. In the disclosure, elements of the power device 1 may be directly connected to the printed circuit board 2 through the bond-wires 7. In the disclosure, the user may perform an operation on the power device 1; and thus the power device 1 may be fine tuned based on a subsequent test after assembly. In the conventional packaged power device, a package casing 9 is adapted to cover the power device. The package casing 9 is fixed on the input and output pin 4 in a box shape, which can not be freely opened. Based on above features, design freedom is improved according to the disclosure. In addition, the power device 1 according to the disclosure does not have the input and output pin 4, thereby avoiding introduction of undesirable inductance, and improving performance of the radio frequency power amplifier module.

Figure 5:
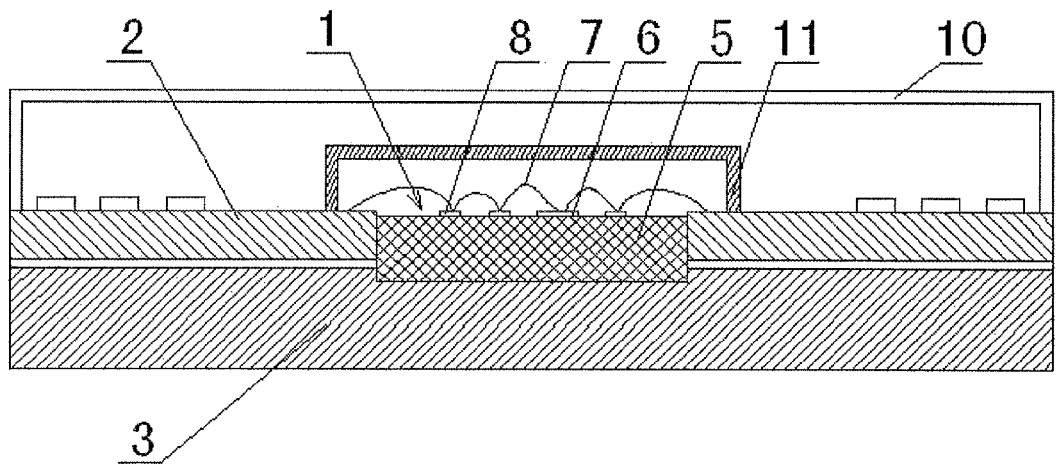
FIG. 5 is another schematic structural diagram of a radio frequency power amplifier module according to an embodiment of the disclosure.

In a case that the carrier flange 5 of the power device 1 has a thickness of relative thick, the carrier flange 5 is disposed as shown in FIG. 5. A designer may provide an accommodating cavity, which matches the carrier flange 5, on the heat dissipating plate 3. The carrier flange 5 is fixedly welded in the accommodating cavity to make the top surfaces of the electronic elements of the carrier flange 5 be flush with the top surface of the printed circuit board 2. Other parts of the device may be disposed and connected in the same way as the foregoing embodiment.

Figure 6:
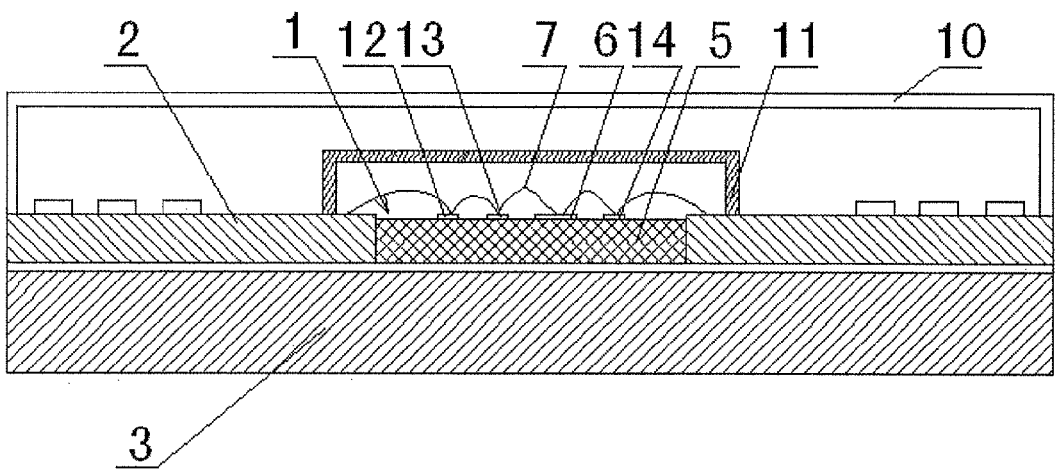
FIG. 6 is another schematic structural diagram of a radio frequency power amplifier module according to an embodiment of the disclosure.

FIG. 6 shows a structure of a power amplifier module, which is another embodiment for the assembly method according to the disclosure. As shown in FIG. 6, electronic elements of a power device 1 include a die 6, a MOS capacitor 8, a drive die 12, an integrated passive device 13 and an integrated passive device 14, where the die 6 is used as an output die. In the same way, the electronic elements are welded on the carrier flange 5 through a wafer welding device, and then the carrier flange 5 is welded on the heat dissipating plate 3. The top surfaces of the electronic elements of the power device 1 are flush with the top surface of the printed circuit board 2. The electronic elements are all directly connected with each other through bond-wires 7, and the electronic elements are directly connected to the printed circuit board through the bond-wires 7.

The foregoing embodiments are only to describe technical ideas and features. Those skilled in the art may understand content of the disclosure and perform implementation based on the above embodiments. The embodiments are not meant to limit the scope of the disclosure. All equivalent alternations or modifications made according to the spirit of the disclosure should fall within the scope of the disclosure.

The invention claimed is:

1. A power device without a package structure in a radio frequency power amplifier module, wherein the radio frequency power amplifier module comprises the power device, a heat dissipating plate and a printed circuit board, the power device is embedded into the printed circuit board, the heat dissipating plate is disposed below the power device and the printed circuit board, and wherein the power device comprises a carrier flange, a plurality of electronic elements and bond-wires, and the electronic elements are adhered to the carrier flange according to a design requirement, the power device and the printed circuit board are fixedly welded on the heat dissipating plate, the electronic elements of the power device are connected with each other through the bond-wires, and the electronic elements are directly connected to the printed circuit board through the bond-wires, wherein the electronic elements comprises a die, the die is directly welded on the carrier flange through a wafer welding device, the carrier flange is welded on the heat dissipating plate and the die is directly connected to the printed circuit board through the bond-wires.

2. The power device without a package structure in a radio frequency power amplifier module according to claim 1, wherein the electronic elements comprises a MOS capacitor and an integrated passive device, the MOS capacitor and the integrated passive device are directly welded on the carrier flange through the wafer welding device, the carrier flange is welded on the heat dissipating plate, the electronic elements are connected with each other through the bond-wires, and the MOS capacitor and the integrated passive device are directly connected to the printed circuit board through the bond-wires.

3. The power device without a package structure in a radio frequency power amplifier module according to claim 1, wherein top surfaces of the electronic elements of the power device are flush with a top surface of the printed circuit board.

4. The power device without a package structure in a radio frequency power amplifier module according to claim 1, wherein a protective cover is disposed outside the power device; the protective cover is fixed on the printed circuit board; and the protective cover completely covers the power device to form a seal cavity, and is adapted to protect the power device and prevent impurities entering into the power device.

5. The power device without a package structure in a radio frequency power amplifier module according to claim 4, wherein a sealant is applied on an edge, connected with the printed circuit board, of the protective cover.

6. An assembly method for a radio frequency power amplifier module wherein the radio frequency power amplifier module comprises the power device without a package structure, a heat dissipating plate and a printed circuit board, the power device is embedded into the printed circuit board, the heat dissipating plate is disposed below the power device and the printed circuit board, and wherein the power device comprises a carrier flange, a plurality of electronic elements and bond-wires, and the electronic elements are adhered to the carrier flange according to a design requirement, the power device and the printed circuit board are fixedly welded on the heat dissipating plate, the electronic elements of the power device are connected with each other through the bond-wires, and the electronic elements are directly connected to the printed circuit board through the bond-wires, and wherein the assembly method comprises: selecting a material and a size of the carrier flange according to the design requirement, and welding the electronic elements on the carrier flange through a device; welding the carrier flange adhered with the electronic elements on the heat dissipating plate, locating the printed circuit board at a position corresponding to the carrier flange, and welding the printed circuit board on the heat dissipating plate; bonding, by a wire bonder, wires between the electronic elements and a matching circuit according to design requirement, and connecting the electronic elements to the printed circuit board through bond-wires directly, wherein the electronic elements comprises a die, the die is directly welded on the carrier flange through a wafer welding device, the carrier flange is welded on the heat dissipating plate and the die is directly connected to the printed circuit board through the bond-wires.

7. The assembly method for a radio frequency power amplifier module according to claim 6, wherein a protective cover is disposed outside the power device, the protective cover is fixed on the printed circuit board and completely covers the power device to form a closed cavity, and a sealant is applied on an edge, connected with the printed circuit board, of the protective cover.

8. The power device without a package structure in a radio frequency power amplifier module according to claim 1, wherein top surfaces of the electronic elements of the power device are flush with a top surface of the printed circuit board.

9. The power device without a package structure in a radio frequency power amplifier module according to claim 2, wherein top surfaces of the electronic elements of the power device are flush with a top surface of the printed circuit board.

\* \* \* \* \*